United States Patent
Amagai

[11] Patent Number: 6,144,102
[45] Date of Patent: Nov. 7, 2000

[54] SEMICONDUCTOR DEVICE PACKAGE

[75] Inventor: Masazumi Amagai, Beppu, Japan

[73] Assignee: Texas Instruments Incorporated, Dallas, Tex.

[21] Appl. No.: 09/080,903

[22] Filed: May 18, 1998

[30] Foreign Application Priority Data

May 16, 1997 [JP] Japan ..................................... 9-143058

[51] Int. Cl.[7] .................................................. H01L 23/48
[52] U.S. Cl. .......................... 257/781; 257/780; 257/784; 257/783; 257/778
[58] Field of Search ................................... 257/780, 781, 257/782, 783, 784, 778, 776

[56] References Cited

U.S. PATENT DOCUMENTS

| | | |
|---|---|---|
| 5,148,265 | 9/1992 | Khandros et al. . |
| 5,821,605 | 10/1998 | Hong et al. . |
| 5,844,168 | 12/1998 | Shueller et al. . |
| 5,886,399 | 3/1999 | Ohsawa et al. . |
| 5,889,333 | 3/1999 | Takenaka et al. . |
| 6,013,946 | 1/2000 | Lee et al. . |
| 6,028,356 | 2/2000 | Kimura . |
| 6,054,773 | 4/2000 | Ohsawa et al. . |

*Primary Examiner*—Sheila V. Clark
*Attorney, Agent, or Firm*—William B. Kempler; Frederick J. Telecky, Jr.

[57] ABSTRACT

The objective of the invention is to reduce the thickness, to improve the heat-releasing property, and to increase the number of terminals that can be assembled, in particular, for the CSP-type semiconductor package. According to this invention, insulating substrate 3 having multiple conductor leads 7 is contained on the first surface. Semiconductor chip 1 equipped with multiple electrode pads 2, which has multiple electrode pads 2 on its principal surface 1, is carried on said insulating substrate 3 with its principal surface facing the aforementioned first surface. Insulating substrate 3 has openings 4 and 5 for exposing inner leads 7a of the conductor leads, as well as multiple electrode pads 2 on the second surface side. Inner leads 7a and electrode pads 2 are connected to each other through conductor leads 9 via said openings 4 and 5. Outer connecting terminals 11 are connected to outer leads 7b of the conductor leads.

19 Claims, 7 Drawing Sheets

SEMICONDUCTOR DEVICE PACKAGE

FIELD OF THE INVENTION

This invention pertains to a package structure of a semiconductor device. In particular, this invention pertains to a type of semiconductor device and its manufacturing method that are appropriate for the CSP-type semiconductor device.

BACKGROUND OF THE INVENTION

Due to the great leap forward in semiconductor IC technology, cellular phones, electronic information terminals, laptop computers, and other portable small-sized and lightweight electronic information equipment have been developed. Every 18 months, the assembly density of the microprocessor doubles. Based on this rule known as Moore's law, the number of transistors assembled in each semiconductor chip is on the rise each year. On the other hand, the package size of the conventional semiconductor devices, such as QFP (Quad Flat Package) and SOJ (Small Out-line J-leaded Package) is larger than semiconductor chips that are several millimeters to just over tens of millimeters in size. This hampers a further increase in the density of the electrode parts and further miniaturization of the electrode information equipment.

CSP (Chip Size Package) is a type of package with an increased density so that the size of the IC package is identical or slightly larger than that of the chip. At present, various. types of CSP semiconductor devices have been proposed. However, there is a problem with the mass production of CSP, that is, its manufacturing cost is higher than that of QFP and other conventional packages. The boosting in the cost of the package is mainly due to the complicated structure and increased number of manufacturing steps.

As a form of the CSP type of semiconductor device, a semiconductor chip is carried on an insulating substrate, with the principal surface of the semiconductor chip facing upward, then wire bonding is performed to connect the conductor leads on the substrate and the electrode pads of the chip. In this case, because the electrode pads, conductor leads, and conductor wires connecting them cannot be exposed to air, it is necessary to completely cover them with a resin. However, sealing with a resin leads to an increase in the thickness of the package, and the heat releasing property of the semiconductor chip deteriorates. In addition, the aforementioned structure has been used in practice on memory IC and other so-called center-bond-type semiconductor chips having a column of electrode pads at the center of the chip's principal surface.

On the other hand, there is the so-called flip chip assembly type of CSP semiconductor device, in which the chip principal surface faces the insulating substrate as it is carried. The flip chip assembly type of semiconductor device is an effective form of technology used to reduce the thickness of the aforementioned package and to improve the heat-releasing property of the chip. However, compared with the wire bonding, the reliability of the connection between the electrode pads and the conductor leads is lower and, because it is hard to see the joint portion, it is difficult to check whether the connection is good.

Another problem with the CSP type of semiconductor device is that the number of the connecting terminals is defined by the chip size. A method that can guarantee the number of the connecting terminals with the highest efficiency is that making use of the BGA (Ball Grid Array) technology with terminals arranged as a 2-dimensional array on the chips principal surface. However, even in this case, since the size of the semiconductor chip is only several millimeters to just over ten millimeters, efforts have to be made to reduce the terminal pitch so as to increase the number of terminals.

The purpose of this invention is to solve the aforementioned problems of the conventional technology by providing a type of semiconductor device with a simple structure that is appropriate for the CSP type of semiconductor device, and that can enable a higher mass productivity and can cut the manufacturing cost.

Another purpose of this invention is to provide a type of semiconductor device using wire bonding, which can reduce the thickness of the package and improve the heat-releasing property of the semiconductor chip.

Yet another purpose of this invention is to provide a CSP type of semiconductor device that can ensure a large number of connecting terminals.

SUMMARY OF THE INVENTION

According to this invention, there is an insulating substrate with multiple conductor leads on the first surface. The semiconductor chip equipped with multiple electrode pads on its principal surface is carried on the aforementioned insulating substrate, with the principal surface of the semiconductor chip facing the aforementioned first surface. The insulating substrate has openings for exposing the inner leads of the aforementioned conductor leads and the aforementioned multiple electrode pads on the second surface side opposite to the side of the aforementioned first surface. By the conductor wires stretching through the aforementioned openings, electrical connection is realized between the aforementioned inner leads and the electrode pads. The aforementioned conductor wires and the aforementioned openings are sealed with a resin or the like applied by bonding or molding, so that they are cut off from air. The outer connecting terminals set on the second surface side of the insulating substrate are connected to the outer leads of the conductor leads. In this case, the inner leads and outer leads of the aforementioned conductor leads are not necessarily the ends of the conductor leads. That is, the inner leads refer to the regions on the conductor leads on which the conductor wires are connected from the electrode pads, and the outer leads refer to the regions on the conductor leads on which the aforementioned outer connecting terminals are connected.

In the semiconductor device in this invention, there is no special limitation on the shape of the assembled semiconductor chip and on the configuration of the electrode pads. However, it is preferably applied on the semiconductor chip having the so-called center bond structure, in which the aforementioned multiple electrode pads are set on a column nearly at the center on the principal surface of the semiconductor chip. Also, the aforementioned outer connecting terminals are preferably the solder bumps set in a 2-dimensional configuration on the surface of the insulating substrate. In this case, the various solder bumps are joined to the outer leads on the opposite side of the substrate through the through-holes formed on the insulating substrate. In addition, the aforementioned insulating substrate in this invention allows the use of ceramic and other hard insulating materials. It is preferred that a polyimide or other flexible insulating material be used.

The aforementioned openings formed on the aforementioned insulating substrate may be formed as two openings for the inner leads of the aforementioned conductor leads and for the aforementioned electrode pads, respectively. Also, they may be formed as a single common opening. When different openings are formed, the aforementioned conductor wires are set across the wall of the aforementioned insulating substrate between these openings. When the conductor wires are sealed with a resin, the aforementioned wall maintains the shape of the conductor wires against the pressure of the resin, so that there is little chance for it to collapse and to make contact with the other conductor wires and inner leads. Also, it is preferred that each of said openings be further divided into multiple openings, mainly for maintaining the strength and continuity of the insulating substrate. There is no special limitation on the size of the opening. However, it is necessary that the automatic joint between the electrode pads and the inner leads by the aforementioned conductor wires not be hampered.

It is preferred that the aforementioned conductor wires and openings be sealed with a resin by means of bonding or molding. In the case of molding injection, as the dam for preventing the spread of the resin on the surface of the insulating substrate, a lead frame is set along the two sides of the aforementioned opening.

This invention is not limited to the semiconductor package. However, it is preferred that it be adopted for the CSP semiconductor package.

This invention also pertains to a type of semiconductor device characterized by the following facts: the aforementioned insulating substrate has a planar size larger than the principal surface of the aforementioned semiconductor chip; it also has a reinforcing part bonded with the side surface of the aforementioned semiconductor chip on the first surface of the aforementioned insulating substrate exposed on the periphery of the aforementioned semiconductor chip. The reinforcing part is integrated with the semiconductor chip, and the appearance looks as if it is larger than the chip size. The area of the insulating substrate is preferably about 100–150% of the area of the principal surface of the semiconductor chip. In this way, it is possible to have more outer terminals that can be assembled on the package in the size of the chip. The aforementioned reinforcing part is preferably a resin molding.

REFERENCE NUMERALS AND SYMBOLS AS SHOWN IN THE DRAWINGS

Figure 1:
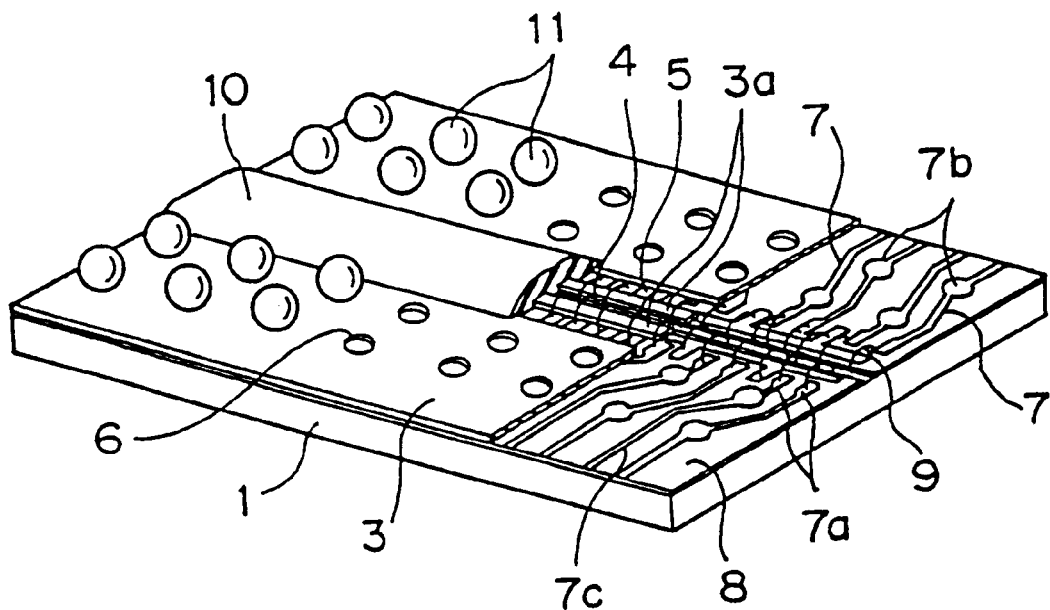
FIG. 1 is an oblique view of the memory device in an embodiment of this invention as seen from the assembly surface side.

In the FIG. 1 represents a semiconductor chip, 1a a principal surface, 2a electrode pad, 3a a Wall, 4 an opening for electrode pad, 5 an opening for inner lead, 6 a through-hole, 7 a conductor lead, 7a an inner lead, 7b an outer lead, 7c a stub, 8 an adhesive layer, 9 a conductor wire, 10 resin, 11 a solder bump, 20 a reinforcing part, 21 a Lead frame, 21a a dam lead, and a 22 molding dies.

DESCRIPTION OF EMBODIMENTS

Figure 2:
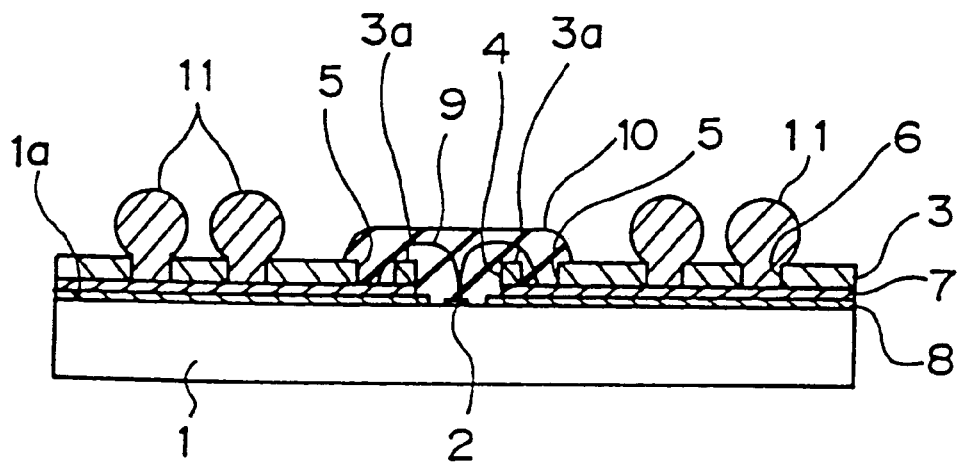
FIG. 2 is a cross-sectional view of FIG. 1.

In the following, this invention will be explained with reference to an embodiment illustrated by figures. In this example, this invention is applied on a memory device having a CSP-type package. FIG. 1 is a diagram illustrating the memory device of this embodiment as seen from the assembly surface side. FIG. 2 is a cross-sectional view. The memory device comprises semiconductor IC chip referred to as semiconductor chip 1 hereinafter and insulating substrate 3. Semiconductor chip 1 has multiple electrode pads 2 set side by side as a column nearly at the center of principal surface 1, that is, the surface on which the IC is formed. For principal surface 1a of semiconductor chip 1, in order to protect the circuit formed in its interior, it is covered with multiple layers of film as explained later. An opening is formed on the film only in the region of electrode pad 2.

Insulating substrate 3 is a film made of a polyimide resin. It is bonded on principal surface 1a of said semiconductor chip 1 through adhesive layer 8. As adhesive layer 8, it is preferred that a thermoplastic polyimide be used; it is also possible to make use of an epoxy resin. Insulating substrate 3 has multiple conductor leads 7 on the surface on the side bonded with said principal surface 1a. As a preferable method for forming conductor leads 7 on insulating substrate 3, copper foil is bonded on insulating substrate 3, with a photographic process being adopted for etching to form the needed conductor pattern. In this case, in order to prevent the oxidation of copper, it is preferred that gold, nickel, etc., be plated on its surface. Each conductor lead 7 extends from the two facing sides of insulating substrate 3 toward the column of electrode pads 2 at the center. Ends 7a of conductor leads 7 on the side of the center are set side by side along the two sides of the column of said electrode pads 2. Ends 7a of the leads are formed with a width larger than the intrinsic line width of conductor leads 7. Here, one end of conductor wire 9 to be explained later is connected. In the following, said ends 7a will be referred to as "inner leads."

Circular region 7b is formed at any central position of each conductor lead 7. When the overall configuration of conductor leads 7 is viewed at a significant distance, said circular regions 7b are set as two columns on each of the two sides of the column of electrode pads 2. In said regions 7b, solder bumps 11 are bonded as to be explained later. In the following, regions 7b will be referred to as "outer leads." Each conductor lead 7 also contains the region of stub 7c extending to the two sides of insulating substrate 3. Stub 7c does not function in relation to the electrical connection between electrode pads 2 of the semiconductor chip and solder bumps 11, yet it can be used as the area on which the contact part makes contact in the probe test of the semiconductor device.

Figure 3:
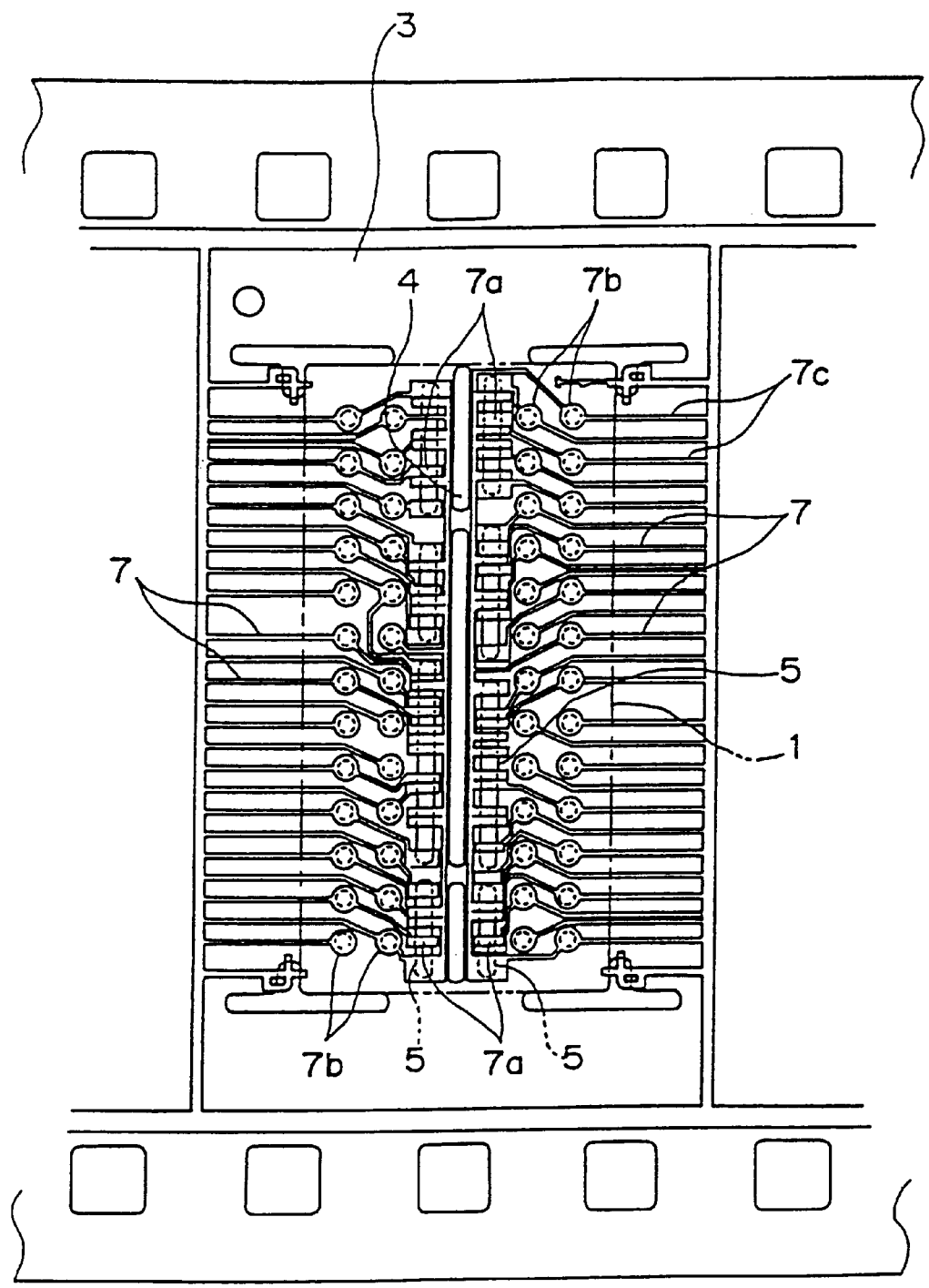
FIG. 3 is a plane view of the insulating substrate after formation of conductor leads on the insulating substrate.

In FIG. 3, the configuration of said conductor leads 7 on insulating substrate 3 is most clearly shown. Insulating substrate 3 is fed as a tape-shaped film having sprocket holes on two sides. The figure illustrates the case before insulating substrate 3 is cut out from the film. Several conductor leads 7 extend from the side of the substrate and terminate at outer leads 7b, without extending to the side of the electrode pads. These conductor leads are dummy leads with no electrical function. After conductor leads 7 are formed on the film, insulating substrate 3 is cut out at the position of the outline of semiconductor chip 1 indicated by the broken line.

Figure 4:
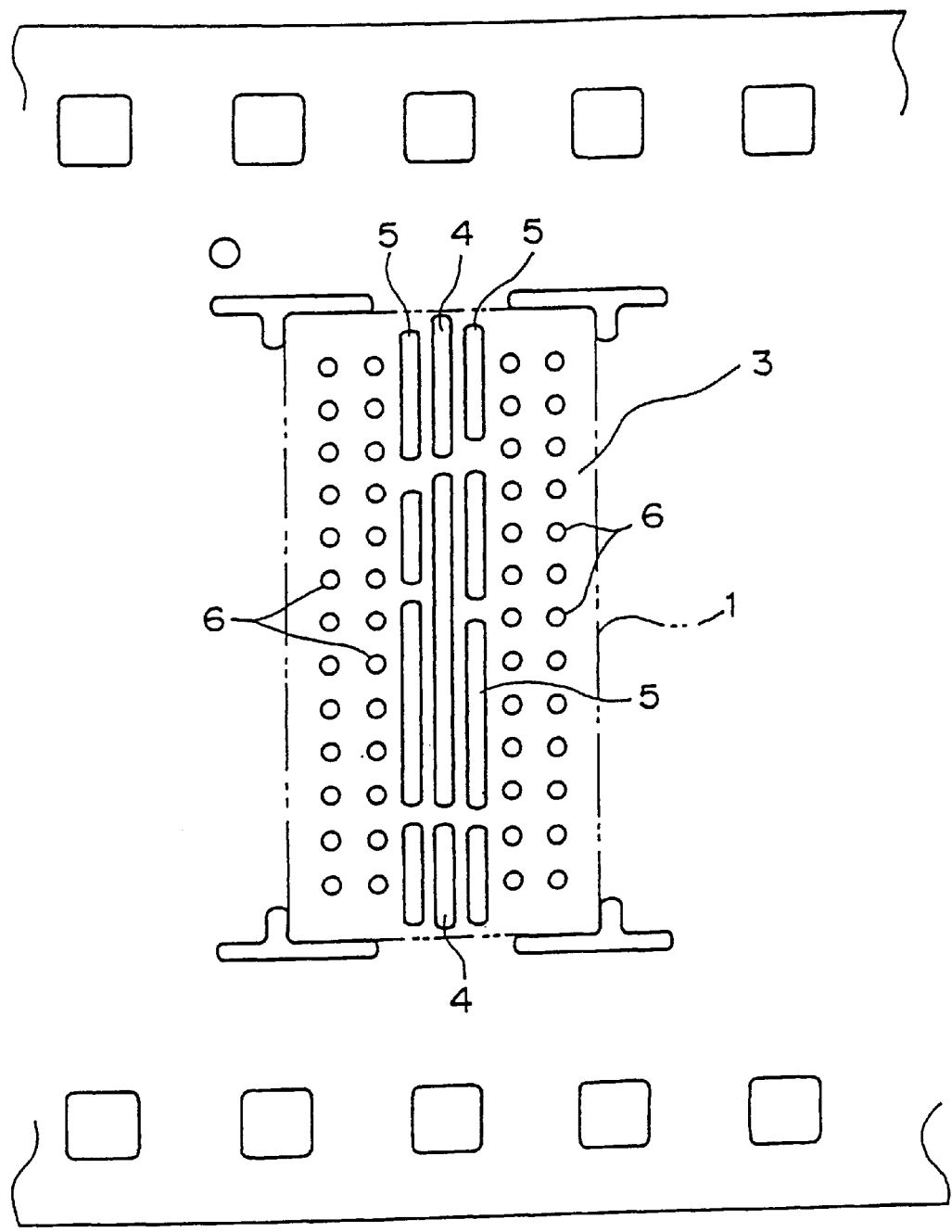
FIG. 4 is a plane view of the insulating film before formation of the conductor leads on the insulating substrate.

Said insulating substrate 3 has multiple openings divided basically into two types, according to the applications. The openings of the initial type are openings 4 for use as electrode pads formed at positions corresponding to the column of said electrode pads 2. In the state in which semiconductor chip 1 is carried on insulating substrate 3, opening 4 for electrode pads exposes electrode pads 2 on the side of the assembly surface of insulating substrate 3. FIG. 4 is a diagram illustrating the state of the insulating film in the step before the formation of conductor leads 7 on insulating substrate 3. In this case, multiple openings, including opening 4 for said electrode pads, are formed. In the following, [an explanation will be made] with reference to FIGS. 1 and 2 as well as FIG. 4. Said openings 4 for electrode pads are formed as three openings set linearly along the column of electrode pads 2. In order to expose electrode pads 2, opening 4 may be a single continuous region. However, it is still divided into multiple openings to maintain the shape of insulating substrate 3 made of a soft polyimide resin film. The second type of openings are openings 5 for inner leads formed corresponding to the column of inner leads 7a of conductor leads 7. Openings 5 for inner leads are also formed as multiple openings just as said openings 4 for electrode pads. FIG. 3 most clearly shows the position relationship between inner leads 7a and openings 5 for inner leads. As an example, both said openings 4 for electrode pads and openings 5 for inner leads have a width of 0.5 mm.

As shown in FIGS. 1 and 2, conductor wires 9 are connected to electrode pads 2 and inner leads 7 through said openings 4 for electrode pads and openings 5 for inner leads. The conventional wire bonding method may be adopted to realize the aforementioned connection. Said conductor wires 9 are set across region 3a referred to as wall hereinafter between openings 4 for electrode pads and openings 5 for inner leads. Resin 10 is used to cover said conductor wires 9 and all of openings 4 and 5 to protect them from exposing to the air. Said resin 10 is formed by dropwise applying a liquid resin known as bonding on the aforementioned region, followed by curing. Said wall 3a displays the function of a guide to prevent the collapse of conductor wires 9 during the molding of resin 10.

On insulating substrate 3, there are through-holes 6 at positions corresponding to outer leads 7b of said conductor leads 7. Through-holes 6 are circular holes smaller than circular outer leads 7b. The inner side of outer leads 7b is exposed on the assembly surface side of insulating substrate 3 through through-holes 6. Solder bumps 11 are formed on through-holes 6. As shown in FIG. 2, through-holes 6 are filled with the solder from a squeegee, with solder balls formed in another step of the operation being transferred onto them. The solder is melted in a reflow oven, forming solder bumps 11 joined to outer leads 7b. As an application example, the diameter of outer leads 7b is 0.8 mm, and the diameter of through-holes 6 is 0.5 mm. Also, the pitch of solder bumps 11 is about 1.27 mm, and the solder balls used have as the specific dimension diameter of 0.75 mm. Other values, such as 1.0 mm, 0.8 mm, 0.5 mm, etc., can be adopted as the pitch of the bumps. It is preferred that the diameter of the solder balls carried be about 50% of the pitch.

Figure 5:
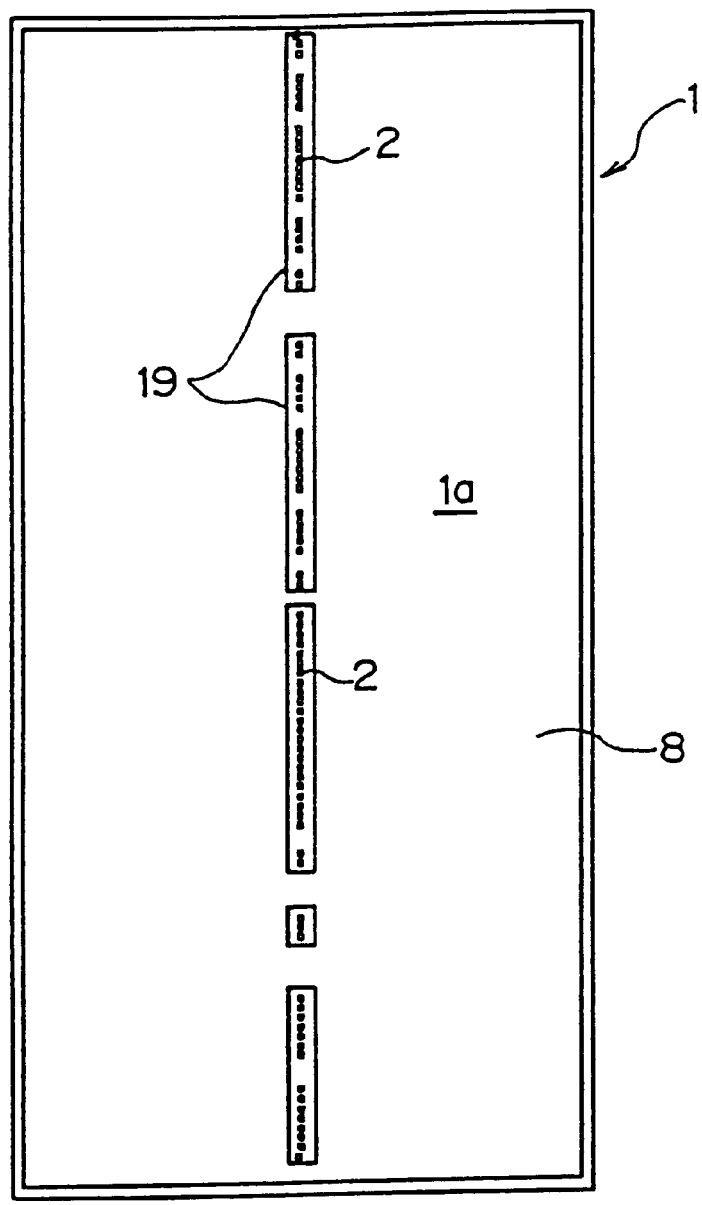
FIG. 5 is a plane view of the principal surface side of the semiconductor device before carrying on the insulating substrate.
Figure 6:
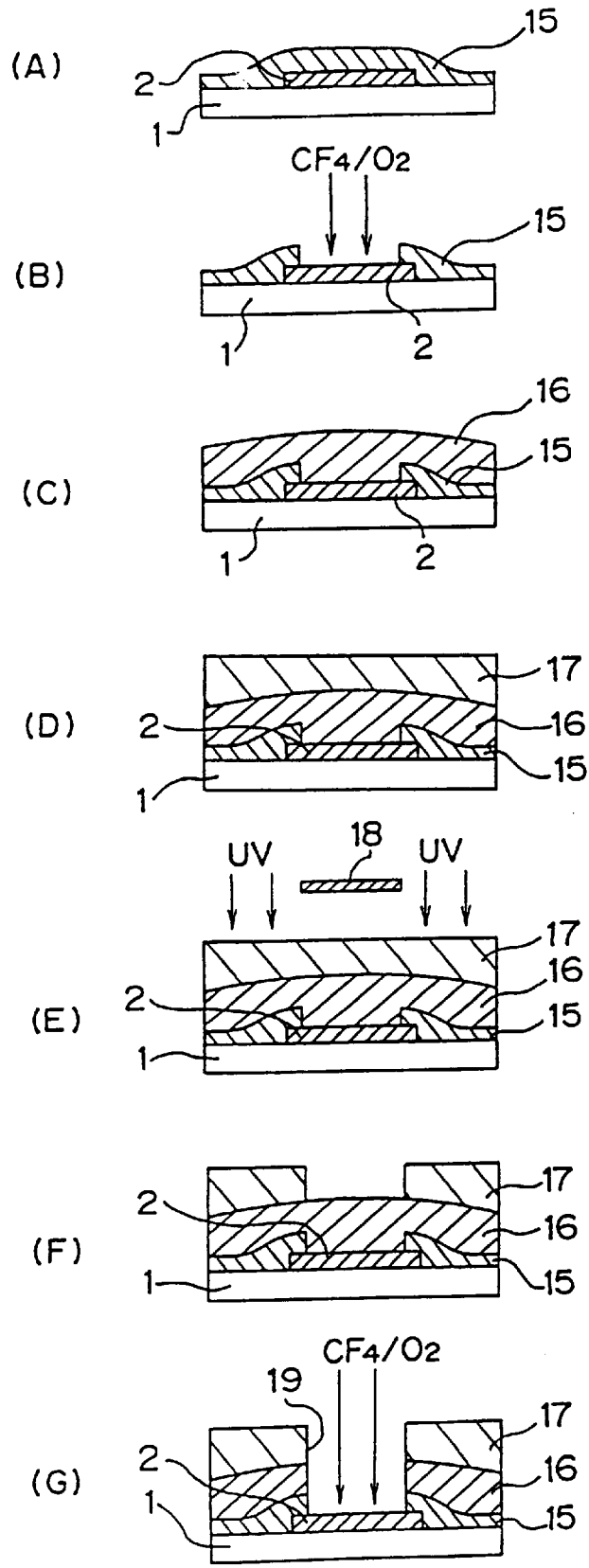
FIG. 6 is a diagram illustrating the step involving formation of the protective film and openings on the semiconductor chip.

FIG. 5 is a plane view of the principal surface side of semiconductor chip 1 before carrying on insulating substrate 3. Multiple protective films [sic; a laminated protective film] are formed on principal surface 1a of semiconductor chip 1, with the uppermost layer of the film being made of adhesive layer 8. In order to expose electrode pads 2 of principal surface 1a, openings 19 are formed on the protective film.

FIGS. 6A–G illustrate the steps for the formation of said protective film and openings 19 on said semiconductor chip 1. In the step of wafer formation before dicing, first of all, electrode pads 2 are formed by patterning a metal made of Al—Si—Cu on semiconductor chip 1, followed by the attachment of silicon oxide film 15 on the entire chip (step A). By plasma etching, the oxide film on electrode pad 2 is removed (step B). Passivation layer 16 made of silicon nitride $Si_3N_4$ is then attached on oxide film 15 (step C). In addition, photosensitive polyimide 17 is attached on passivation layer 16 (step D). Photosensitive polyimide 17 functions as adhesive layer 8 for bonding semiconductor chip 1 on insulating substrate 3. Said electrode pads 2 are covered with mask 18, with a reaction being undertaken for photosensitive polyimide 17 using UV light at a wavelength of 350–470 nm (step E). Photosensitive polyimide 17 is developed, then the region covered with mask 18 is removed, followed by a thermocondensation reaction of said polyimide 17 at about 350° C. (step F). Finally, by plasma etching, passivation layer 16 on electrode pads 2 is removed, exposing electrode pads 2.

Figure 7:
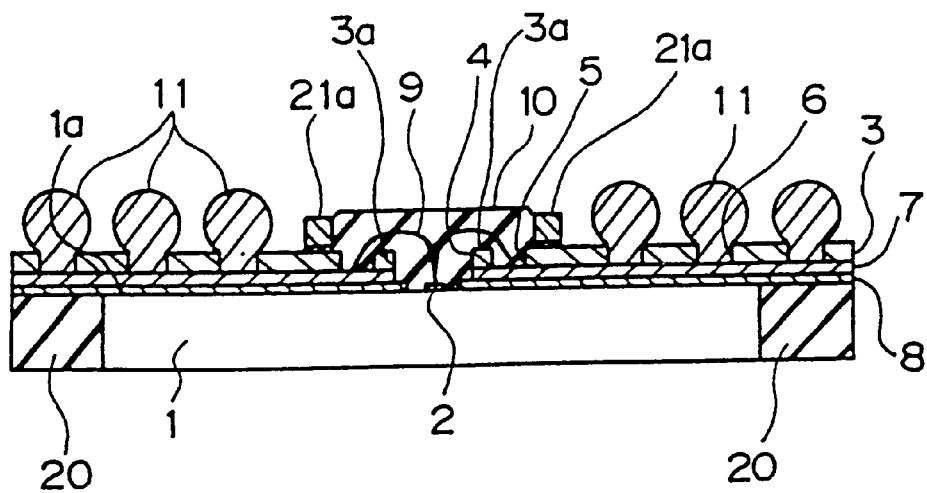
FIG. 7 is a cross-sectional view of the memory device in another embodiment of this invention.

In the following, another embodiment of the present invention will be explained. FIG. 7 is a cross-sectional view of the memory device in the other embodiment of this invention. The same part numbers as those used in the aforementioned embodiment are used to represent the same structural parts in this embodiment, so they will not be explained again. The memory device in this embodiment differs from the previous memory device in that it has insulating substrate 3 wider than semiconductor chip 1. Accompanying this, there are six columns of solder bumps 11. The terminals in the previous memory device include 52 pins (13×4 columns), yet the memory device in this embodiment has 78 pins (13×6) columns. That is, by making insulating substrate 3 wider than semiconductor chip 1, it is possible to increase the number of solder bumps 11 that can be assembled without changing the pitch. Also, while not shown in the figure, in this embodiment, the width in the longitudinal direction of insulating substrate 3, that is, the depth shown in the figure, is identical to that of the previous example, and it is equal to the width of semiconductor chip 1.

On the inner surface side of the portion of said insulating substrate 3 that goes over semiconductor chip 1, there is reinforcing part 20. Said reinforcing part 20 is a parallelepiped resin block set along the two sides of semiconductor chip 1. One surface on the inner side of reinforcing part 20 is bonded on the inner surface of insulating substrate 3, and the other surface on the inner side is bonded on the side surface of semiconductor chip 1. In this way, reinforcing part 20 is integrated with the memory device. Also, one surface on the outer side of reinforcing part 20 is connected to the inner surface of semiconductor chip 1, and the other surface is set aligned with the end of insulating substrate 1.

The second point of this memory device differs from the previous memory device in that together with the molding of resin 10 using the molding method, it is also equipped with dam leads 21a provided by lead frame 21 (see FIG. 9) along the two sides of openings 4 and 5 of insulating substrate 3. Dam leads 21a are for restricting the flow of the resin during molding. Dam leads 21a are bonded on the surface of insulating substrate 3 with epoxy or a polyimide adhesive. They are not removed even after the molding of resin 10, and remain there to form a portion of the memory device. The main reason for using dam leads 21a to perform the molding of resin 10 is that it enables the molding with the formation of said reinforcing part 20.

Figure 8:
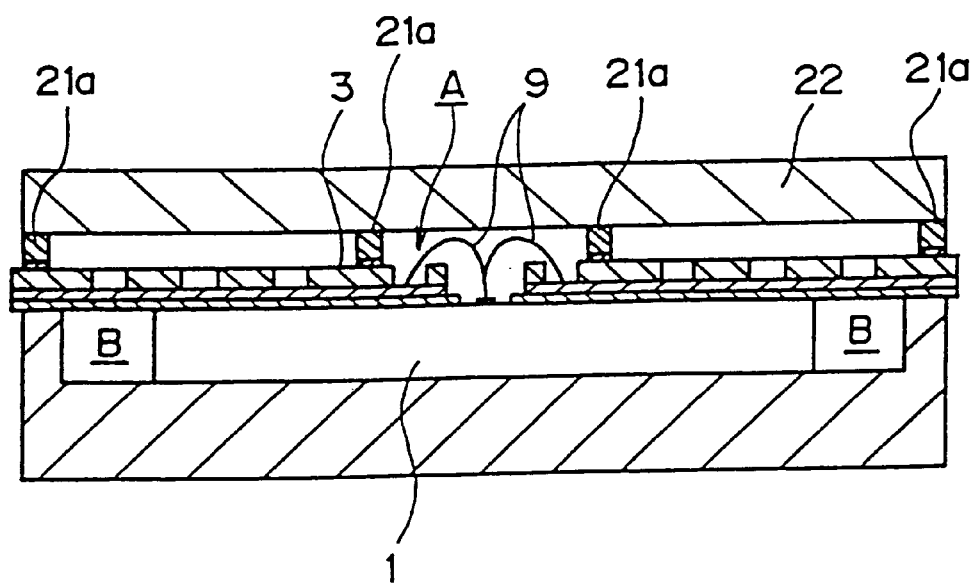
FIG. 8 is a cross-sectional view illustrating the state in which the memory device is accommodated in the molding dies.
Figure 9:
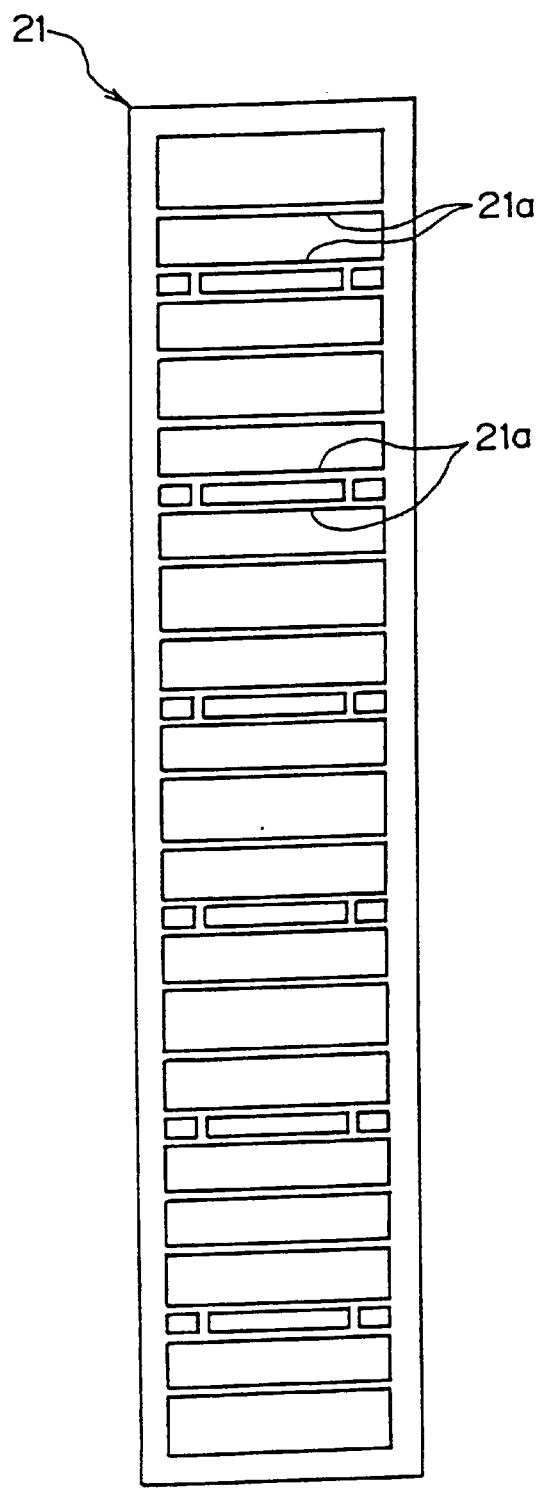
FIG. 9 is a plane view of the lead frame.

FIG. 8 is a diagram illustrating the method for molding said reinforcing part 20 and resin 10. Semiconductor chip 1 is carried on insulating substrate 3, then wire bonding is performed. Afterwards, dam leads 21a of the lead frame are bonded on insulating substrate 3. As shown in FIG. 9, on one lead frame 21, multiple dam leads 21a are formed for each memory device. Dam leads 21a are not cut off from lead frame 21. Instead, they are bonded on the surface of insulating substrate 3 fed as a tape-shaped film. For each memory device, four dam leads 21a are formed. The inner two dam leads 21a are set on the two sides of openings 4 and 5 of insulating substrate 3, functioning as dams during the molding of resin 10. The outer two dam leads are bonded on the outer side of the region cut out as the insulating substrate of the tape-shaped film, acting as pressing parts for sandwiching insulating substrate 3 by molding dies 22. As lead frame, it is possible to make use of 42 alloy, copper, etc. The memory device is reliably sandwiched under a pressure of 500–1000 t between molding dies 22. In spaces A and B shown in the figure, the molding resin is injected under pressure applied by a plunger, followed by curing until thermosetting of the resin. As shown in FIG. 7, resin 10 and reinforcing part 20 are obtained. From a tape-shaped film, insulating substrate 3 is then punched out. Subsequently, solder is filled in through-holes 6 by means of a squeegee. Solder balls are then transferred on the through-holes and are heated for reflow, forming solder bumps 11. In this way, a memory device is completed.

In the above, the embodiments of this invention have been explained with reference to FIGS. However, the application range of this invention is not limited to the aforementioned embodiments. The semiconductor devices as subjects of this invention are not limited to the aforementioned types of memory devices; they include the surface assembly type of logic IC, analog IC, and all the other types of semiconductor devices. Also, this invention can be applied on packages other than BGA. Said reinforcing part 20 may also be the resin block provided by the other methods, as well as metals and materials other than resins.

According to this invention, the obtained semiconductor device has a simple structure, a low manufacturing cost, and a high mass productivity. This technology is preferably adopted for the CSP-type semiconductor devices.

This invention provides a type of semiconductor device using wire bonding, characterized by the fact that the thickness of the package is reduced and the heat-releasing performance is improved.

Also, this invention can ensure larger connecting terminals in the CSP type semiconductor device.

What is claimed is:

1. A semiconductor device comprising:
    a semiconductor chip having multiple electrode pads on a principal surface;
    an insulating substrate attached directed to said chip by an adhesive and having multiple conductor leads on a first surface, carrying the semiconductor chip with its principal surface facing the first surface, and having openings for exposing the inner leads of the conductor leads and the multiple electrode pads on a second surface side opposite to the first surface;
    conductor wires making an electrical connection between the inner leads and the electrode pads through the opening;
    a sealing material covering at least the conductor wires and the openings;
    and outer connecting terminals set on the second surface side of the insulating substrate and making an electrical connection with the outer leads of the conductor leads.

2. The semiconductor device described in claim 1, wherein the openings at least include a first opening for exposing the multiple electrode pads and a second opening for exposing the inner leads; with the conductor wires arranged crossing the wall made of the insulating substrate between the first opening and the second opening.

3. The semiconductor device described in claim 2, wherein the first and second openings are divided into multiple openings set linearly side by side.

4. A semiconductor device comprising:
    a semiconductor chip having multiple electrode pads on a principal surface;
    an insulating substrate attached directed to said chip by an adhesive and having multiple conductor leads on a first surface, carrying the semiconductor chip with its principal surface facing the first surface, and having openings for exposing the inner leads of the conductor leads and the multiple electrode pads on a second surface side opposite to the first surface the openings at least include a first opening for exposing the multiple electrode pads and a second opening for exposing the inner leads with the conductor wires arranged crossing the wall made of the insulating substrate between the first opening and the second opening;
    conductor wires making an electrical connection between the inner leads and the electrode pads through the opening;
    a sealing material covering at least the conductor wires and the openings;
    and outer connecting terminals set on the second surface side of the insulating substrate and making an electrical connection with the outer leads of the conductor leads;
    and a lead frame having the first and second openings as the space and arranged along the two sides of the openings.

5. The semiconductor device described in claim 1, wherein the insulating substrate has multiple through-holes for exposing the outer leads on the second surface side, with the outer connecting terminals being solder bumps for making an electrical connection with the outer leads through the through-holes.

6. The semiconductor device described in claim 1, wherein the semiconductor chip has the multiple electrode pads set as a column at nearly the center of the principal surface.

7. The semiconductor device described in claim 6, wherein the inner leads are set along the two sides of the electrode pad, with the outer leads being set 2-dimensionally on each side of the principal surface of the semiconductor device divided by the electrode pad column.

8. The semiconductor device described in claim 1, wherein the insulating substrate is a flexible insulating film.

9. The semiconductor device described in claim 1, wherein the insulating substrate has nearly the same planar size as that of the principal surface of the semiconductor chip.

10. The semiconductor device described in claim 1, wherein the insulating substrate has a planar size larger than that of the principal surface of the semiconductor chip, and having a reinforcing part bonded with the side surface of the semiconductor chip on the first surface of the insulating substrate exposed on the periphery of the semiconductor chip.

11. The semiconductor device described in claim 10, wherein the reinforcing part is a resin molding.

12. The semiconductor device described in claim 11, wherein the reinforcing part has a first surface, which has the same height as the inner surface of the semiconductor chip and is continuous to the inner surface, and a second surface positioned on the end of the insulating substrate and is nearly at a right angle to the first surface.

13. The semiconductor device described in claim 4, wherein the first and second openings are divided into multiple openings set linearly side by side.

14. The semiconductor device described in claim 4, wherein the insulating substrate has multiple through-holes for exposing the outer leads on the second surface side, with the outer connecting terminals being solder bumps for making an electrical connection with the outer leads through the through-holes.

15. The semiconductor device described in claim 4, wherein the semiconductor chip has the multiple electrode pads set as a column at nearly the center of the principal surface.

16. The semiconductor device described in claim 4, wherein the insulating substrate is a flexible insulating film.

17. The semiconductor device described in claim 4, wherein the insulating substrate has nearly the same planar size as that of the principal surface of the semiconductor chip.

18. The semiconductor device described in claim 4, wherein the insulating substrate has a planar size larger than that of the principal surface of the semiconductor chip, and having a reinforcing part bonded with the side surface of the semiconductor chip on the first surface of the insulating substrate exposed on the periphery of the semiconductor chip.

19. The semiconductor device described in claim 18, wherein the reinforcing part is a resin molding and has a first surface, which has the same height as the inner surface of the semiconductor chip and is continuous to the inner surface, and a second surface positioned on the end of the insulating substrate and is nearly at a right angle to the first surface.

* * * * *